(12) United States Patent
Park et al.

(10) Patent No.: US 7,488,687 B2
(45) Date of Patent: Feb. 10, 2009

(54) METHODS OF FORMING ELECTRICAL INTERCONNECT STRUCTURES USING POLYMER RESIDUES TO INCREASE ETCHING SELECTIVITY THROUGH DIELECTRIC LAYERS

(75) Inventors: Wan Jae Park, Fishkill, NY (US); Jae Hak Kim, Fishkill, NY (US); Tong Qing Chen, Singapore (SG); Yi-hsiung Lin, Taipei (TW)

(73) Assignees: Samsung Electronics Co., Ltd. (KR); Chartered Semiconductor Manufacturing, Ltd., Singapore (SG); International Business Machines Corporation, Armonk, NY (US)

( * ) Notice: Subject to any disclaimer, the term of this patent is extended or adjusted under 35 U.S.C. 154(b) by 190 days.

(21) Appl. No.: 11/530,952

(22) Filed: Sep. 12, 2006

(65) Prior Publication Data

US 2008/0064199 A1      Mar. 13, 2008

(51) Int. Cl.
*H01L 21/00* (2006.01)
(52) U.S. Cl. ............... 438/700; 438/696; 438/711; 438/725; 438/738; 257/E21.024; 257/E21.025; 257/E21.252; 257/E21.259; 257/E21.486
(58) Field of Classification Search ........... 438/700, 438/725, 711, 696, 738; 257/E21.024, E21.025, 257/E21.252, E21.259, E21.486, E21.577, 257/E21.579
See application file for complete search history.

(56) References Cited

U.S. PATENT DOCUMENTS

| | | | |
|---|---|---|---|
| 4,371,407 A * | 2/1983 | Kurosawa | 438/526 |
| 5,942,446 A | 8/1999 | Chen et al. | |
| 5,990,007 A * | 11/1999 | Kajita et al. | 438/680 |
| 6,184,142 B1 | 2/2001 | Chung et al. | |
| 6,284,149 B1 * | 9/2001 | Li et al. | 216/64 |
| 6,524,964 B2 | 2/2003 | Yu | |

(Continued)

FOREIGN PATENT DOCUMENTS

JP           362219960 A    *   9/1987

(Continued)

OTHER PUBLICATIONS

Process for Fabrications of Shallow and Deep Silicon Dioxide FilledTrenches, IBM Technical Digest, Apr. 1, 1980.*

*Primary Examiner*—Michael S Lebentritt
(74) *Attorney, Agent, or Firm*—Myers Bigel Sibley & Sajovec

(57) ABSTRACT

Methods of forming electrical interconnect structures include forming a dielectric layer on a semiconductor substrate and forming a hard mask layer on the dielectric layer. A photoresist layer is patterned on an upper surface of the hard mask layer. This patterned photoresist layer is used as an etching mask during a step to selectively etch the hard mask layer and define an opening therein. This opening exposes the first dielectric layer. The patterned photoresist layer is then stripped from the hard mask layer using an ashing process that exposes the upper surface of the hard mask layer. Following this ashing process, a portion of the first dielectric layer extending opposite the opening is selectively etched using the hard mask layer as an etching mask. During this selective etching step, polymer residues are accumulated directly on the upper surface of the hard mask layer. These polymer residues may operate to increase a degree of selectively and inhibit recession of the hard mask layer during the step of selectively etching the first dielectric layer.

20 Claims, 6 Drawing Sheets

U.S. PATENT DOCUMENTS

| | | |
|---|---|---|
| 6,593,246 B1 | 7/2003 | Hasegawa et al. |
| 6,617,253 B1 | 9/2003 | Chu et al. |
| 6,689,695 B1 * | 2/2004 | Lui et al. .................... 438/700 |
| 6,740,566 B2 * | 5/2004 | Lyons et al. ................ 438/424 |
| 6,793,832 B1 | 9/2004 | Saito et al. |
| 6,905,800 B1 * | 6/2005 | Yuen et al. ..................... 430/5 |
| 6,927,178 B2 * | 8/2005 | Kim et al. ................... 438/778 |
| 7,265,056 B2 * | 9/2007 | Tsai et al. ................... 438/725 |
| 7,285,853 B2 * | 10/2007 | Liu ............................. 257/734 |

FOREIGN PATENT DOCUMENTS

| | | |
|---|---|---|
| JP | 405102101 A * | 4/1993 |
| JP | 11-067909 | 3/1999 |
| JP | 2000-133638 | 5/2000 |
| JP | 2001-044189 | 2/2001 |
| JP | 2003-188253 | 7/2003 |
| JP | 2003-303811 | 10/2003 |
| JP | 2005-203429 | 7/2005 |
| KR | 1020000076668 A | 12/2000 |
| KR | 1020010015338 A | 2/2001 |
| KR | 2001-0080234 | 8/2001 |
| KR | 1020030001089 A | 1/2003 |
| KR | 2003-0041203 | 5/2003 |

* cited by examiner

METHODS OF FORMING ELECTRICAL INTERCONNECT STRUCTURES USING POLYMER RESIDUES TO INCREASE ETCHING SELECTIVITY THROUGH DIELECTRIC LAYERS

FIELD OF THE INVENTION

The present invention relates to integrated circuit fabrication methods and, more particularly, to methods of fabricating integrated circuit devices having electrical interconnect structures therein.

BACKGROUND OF THE INVENTION

Conventional methods of forming integrated circuit devices may include steps to form single and/or dual damascene structures using copper (Cu) as an electrical interconnect material. As illustrated by FIGS. 1A-1E, a conventional damascene process may utilize a multi-layered mask structure to support selective etching of one or more underlying dielectric layers. In particular, FIG. 1A illustrates steps to form a relatively porous low-k inter-layer dielectric (ILD) layer 12 on an underlying dielectric layer 10, which may be a inter-metal dielectric (IMD) layer. This low-k ILD layer 12 may be formed of a material, such as SiCOH, which has a dielectric constant less than a dielectric constant of silicon dioxide ($SiO_2$). FIG. 1A also illustrates steps to form a multi-layered mask (MLM) layer on the ILD layer 12. This multi-layered mask layer is illustrated as including a hard mask layer 14 (e.g., $SiO_2$ layer), an organic planarization layer (OPL) 16, a low temperature oxide (LTO) layer 18, an antireflective coating (ARC) 20 and a patterned photoresist (PR) layer 22. As illustrated by FIG. 1B, a selective etching step is performed to etch through the antireflective coating 20, the LTO layer 18 and the OPL layer 16 in sequence using the patterned photoresist layer 22 as an etching mask. The patterned photoresist layer 22 and the antireflective coating 20 are then removed.

Referring now to FIGS. 1C-1D, another selective etching step is performed to etch through and form a via opening within the hard mask layer 14 and the ILD layer 12 and define a recess within the IMD layer 10, using the patterned OPL layer 16 as an etching mask. The patterned OPL layer 16 is then removed. This OPL layer 16 may be removed using an ashing process that is performed in an oxygen ambient. Unfortunately, this ashing process may operate to convert sidewall portions of a SiCOH-type ILD layer 12, which are exposed to the ashing process, into silicon dioxide. This conversion process may occur in response to the removal of carbon (C) and hydrogen (H) atoms from the ILD layer 12. Thereafter, as illustrated by FIG. 1E, a cleaning process using a diluted hydrofluoric acid (DHF) solution may cause an undercutting (i.e., recession) of the sidewalls of the ILD layer 12 relative to the hard mask layer 14 because DHF operates as an etchant to silicon dioxide. This undercutting of the sidewalls of the ILD layer 12 may result in the formation of voids within an electrically conductive via (e.g., copper plug, not shown) that is subsequently formed within the opening in the hard mask layer 14 and the ILL) layer 12. The formation of such voids may result in reduced device yield by reducing the reliability of electrical interconnects within an integrated circuit chip.

SUMMARY OF THE INVENTION

Embodiments of the present invention include methods of forming electrical interconnect structures that are compatible with damascene fabrication techniques. These methods include forming an electrical interconnect structure by forming a first dielectric layer having a first dielectric constant on a semiconductor substrate and then forming a hard mask layer on the first dielectric layer. The hard mask layer includes a material having a second dielectric constant that is greater than the first dielectric constant. An exemplary hard mask layer may include silicon dioxide or tetraethylorthosilicate (TEOS). A photoresist layer is then patterned on an upper surface of the hard mask layer. This patterned photoresist layer is used as an etching mask during a step to selectively etch the hard mask layer and define an opening therein. This opening exposes the first dielectric layer. The patterned photoresist layer is then stripped from the hard mask layer using an ashing process that exposes the upper surface of the hard mask layer. Following this ashing process, a portion of the first dielectric layer extending opposite the opening is selectively etched using the hard mask layer as an etching mask. During this selective etching step, polymer residues are accumulated directly on the upper surface of the hard mask layer. These polymer residues may operate to increase a degree of selectivity and inhibit recession of the hard mask layer during the step of selectively etching the first dielectric layer. The etched portion of the first dielectric layer may then be exposed to a diluted hydrofluoric acid (DHF) solution.

According to further aspects of these embodiments, the step of selectively etching a portion of the first dielectric layer comprises selectively etching a portion of the first dielectric layer using a dry etching technique. This dry etching technique may include using a fluorine-based source gas. In particular, the step of selectively etching a portion of the first dielectric layer may include exposing the portion of the first dielectric layer to a first source gas including CF4 and a second source gas including H2. To achieve a desired degree of etching selectively and relatively high etch rate, a ratio of a volumetric flow rate of the second source gas relative to the first source gas is greater than about 0.25 for the case where the first source gas is CF4 and the second source gas is H2. For example, the volumetric flow rate of the second source gas may be greater than about 40 sccm and a volumetric flow rate of the first source gas may be about than about 150 sccm.

In alternative embodiments of the invention, the fluorine-based source gas includes CF4 and CHF3 and a combined volumetric flow rate of CF4 and CHF3 is in a range from about 10 sccm to about 20 sccm. This fluorine-based source gas may be used in combination with an oxygen ($O_2$) source gas that is supplied at a volumetric flow rate of about 10 sccm and an argon source gas that is supplied at a volumetric flow rate of about 400 sccm. In still further embodiments of the invention, the fluorine-based source gas may include a combination of CF4 and CH2F2 or a combination of CH3F and CH2F2.

According to still further embodiments of the invention, the step of patterning a photoresist layer on the hard mask layer may be preceded by a step of depositing an antireflective coating directly on the upper surface of the hard mask layer. The stripping step may also include stripping the patterned photoresist layer and the antireflective coating from the hard mask layer. The step of selectively etching a portion of the first dielectric layer may also include etching an opening in the first dielectric layer and then forming a copper interconnect via in the etched opening.

DETAILED DESCRIPTION OF PREFERRED EMBODIMENTS

Figure 1A:
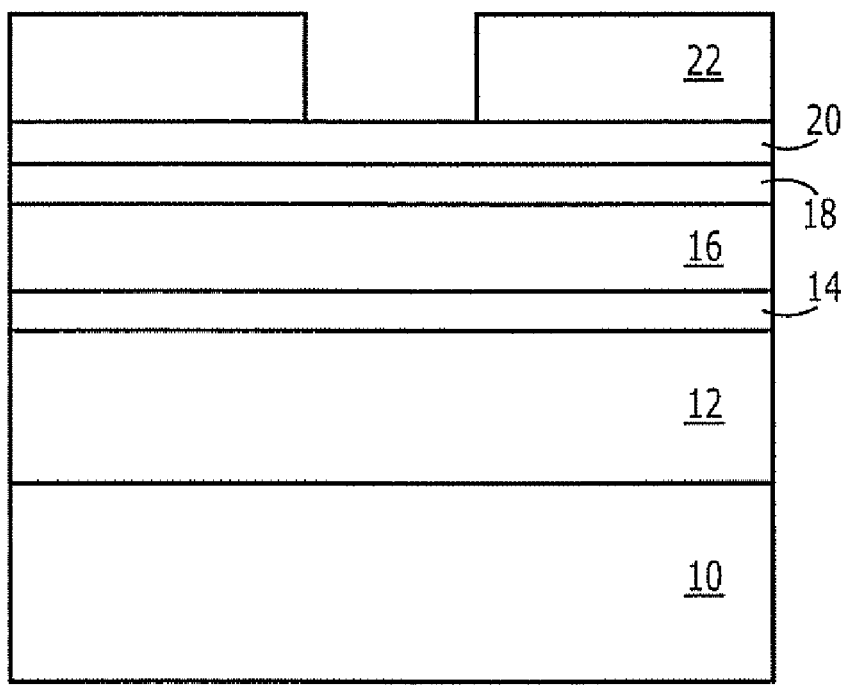
FIGS. 1A-1E are cross-sectional views of intermediate structures that illustrate a conventional damascene process.
Figure 1B:
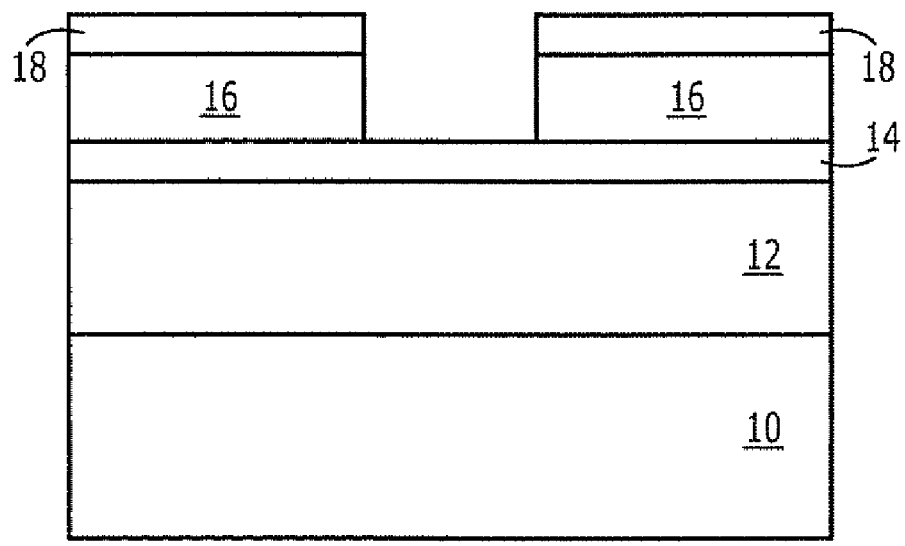
Figure 1C:
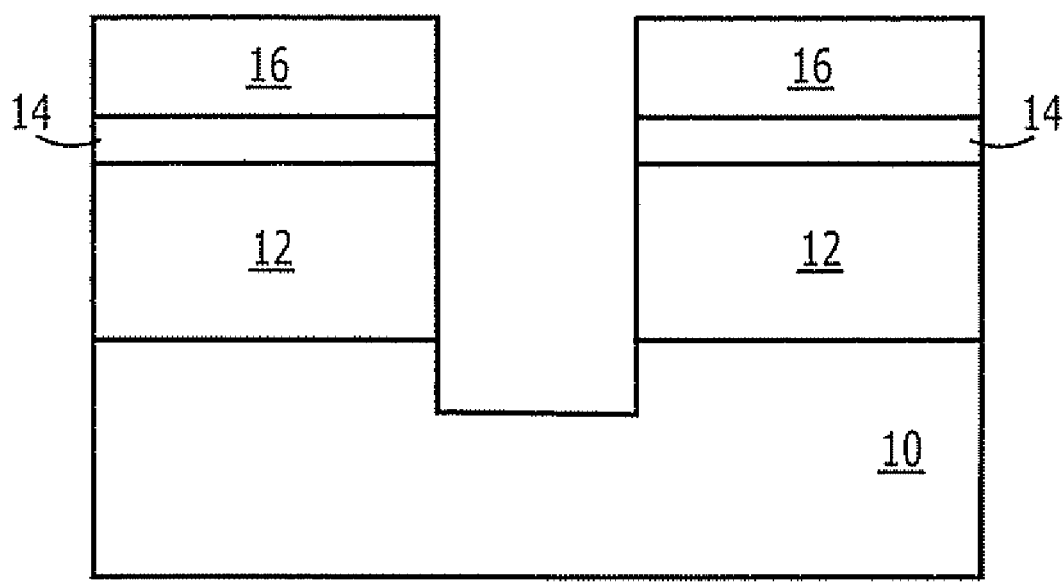
Figure 1D:
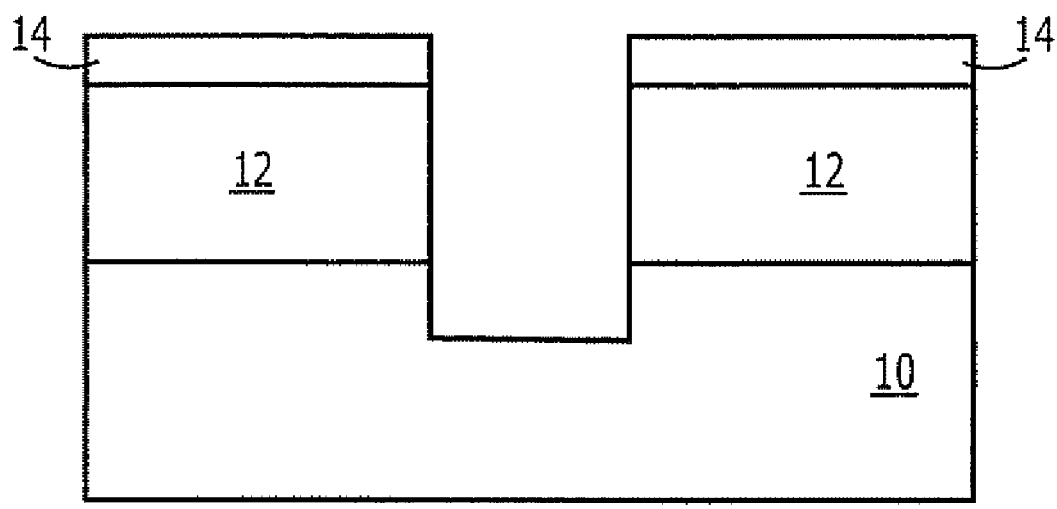
Figure 1E:
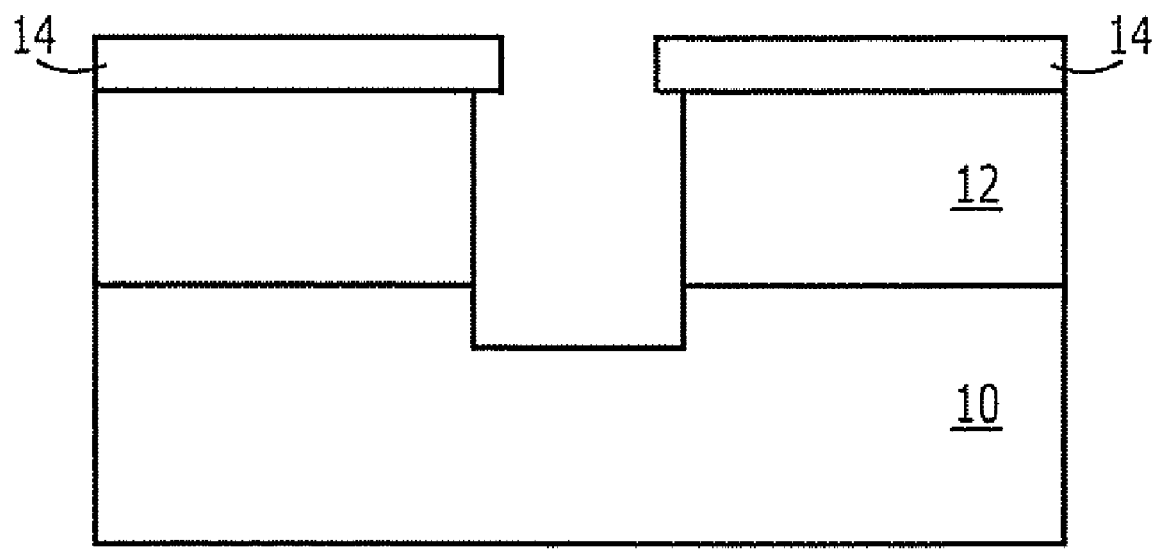

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
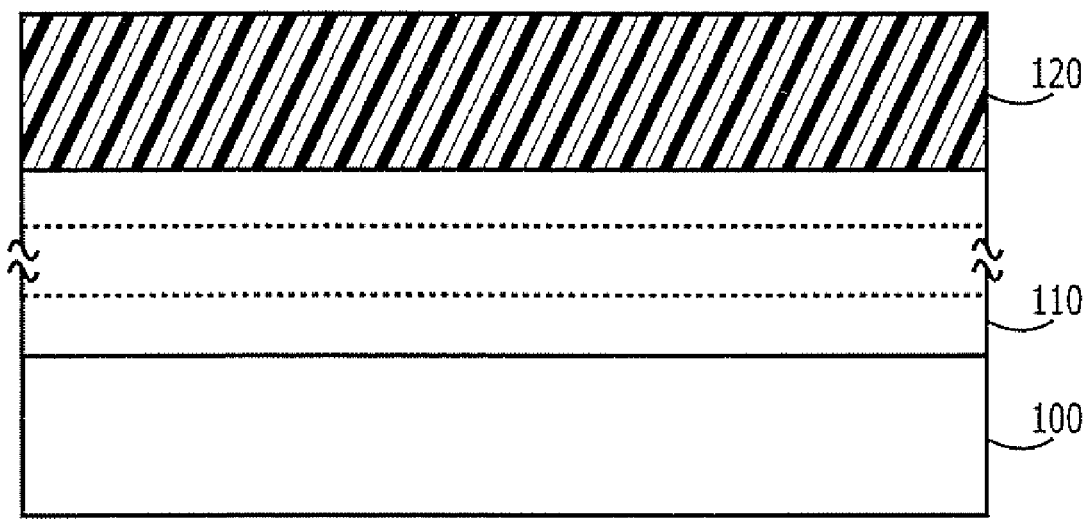
FIGS. 2A-2F are cross-sectional views of intermediate structures that illustrate methods of forming electrical interconnect structures according to embodiments of the present invention.

Methods of forming electrical interconnect structures according to embodiments of the present invention may include forming a single or multi-layered structure 110 on a semiconductor substrate 100, as illustrated by FIG. 2A. This structure 110 may include, among other things, an intermetal dielectric (IMD) layer having patterned wiring interconnects (not shown) therein. This intermetal dielectric layer may be formed using an electrically insulating material, such as a silicon dioxide layer or another dielectric having a relatively low dielectric constant, that supports a reduction in parasitic coupling capacitance between electrically conductive regions (not shown) within the intermetal dielectric layer. A first dielectric layer 120 is formed on the multi-layered structure 110. This first dielectric layer 120 may be formed of a material having a first dielectric constant. In particular, the first dielectric layer 120 may be formed as a p-SiCOH layer having a thickness in a range from about 1000 Å to about 3000 Å.

Figure 2B:
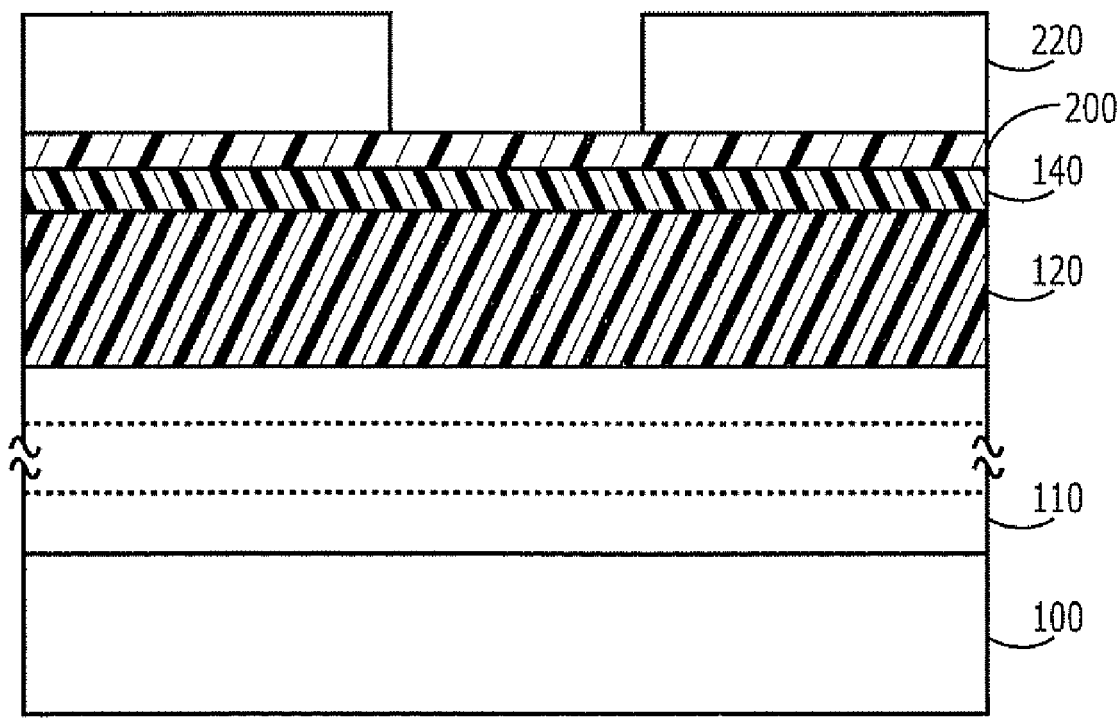

Referring now to FIG. 2B, an electrically insulating hard mask layer 140 is formed directly on an upper surface of the first dielectric layer 120. This hard mask layer 140 may be a silicon dioxide layer or other material layer (e.g., tetraethylorthosilicate (TEOS) layer) that can be selectively etched relative to the first dielectric layer 120. Thus, the hard mask layer 140 may be formed of a material having a second dielectric constant greater than the first dielectric constant. This hard mask layer 140 may have a thickness in a range from about 150 Å to about 600 Å. The hard mask layer 140 is covered with an antireflective coating layer 200 that enhances accuracy of subsequently performed photolithographically-defined patterning steps. This antireflective coating layer 200 may be formed as an organic layer having a thickness in a range from about 200 Å to about 800 Å.

Figure 2C:
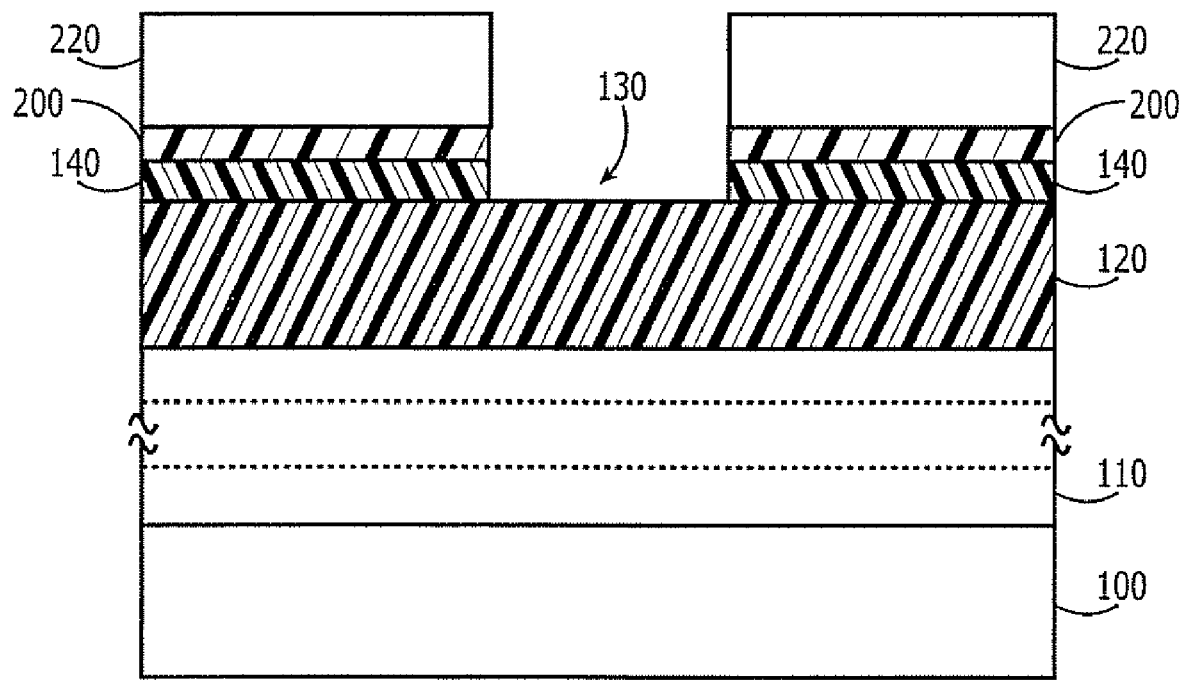
Figure 2D:
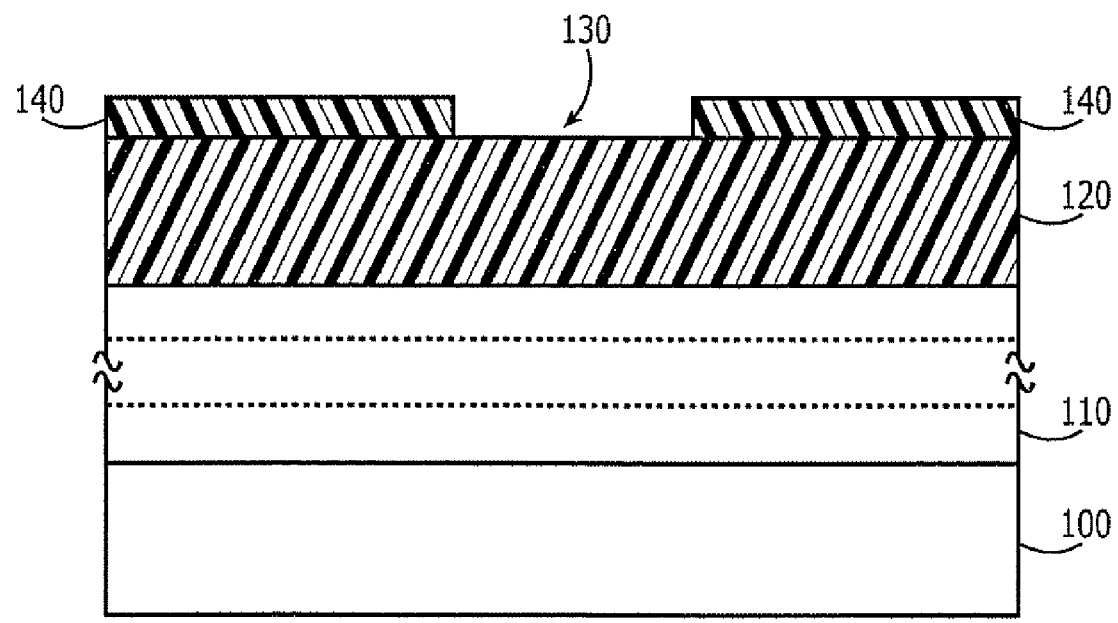
Figure 2E:
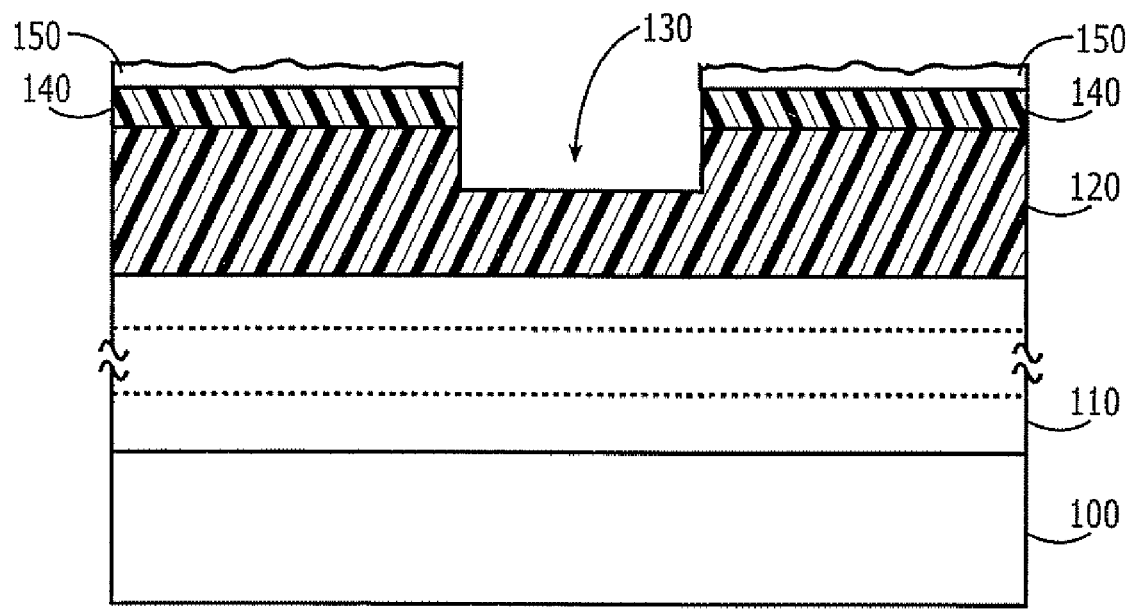
Figure 2F:
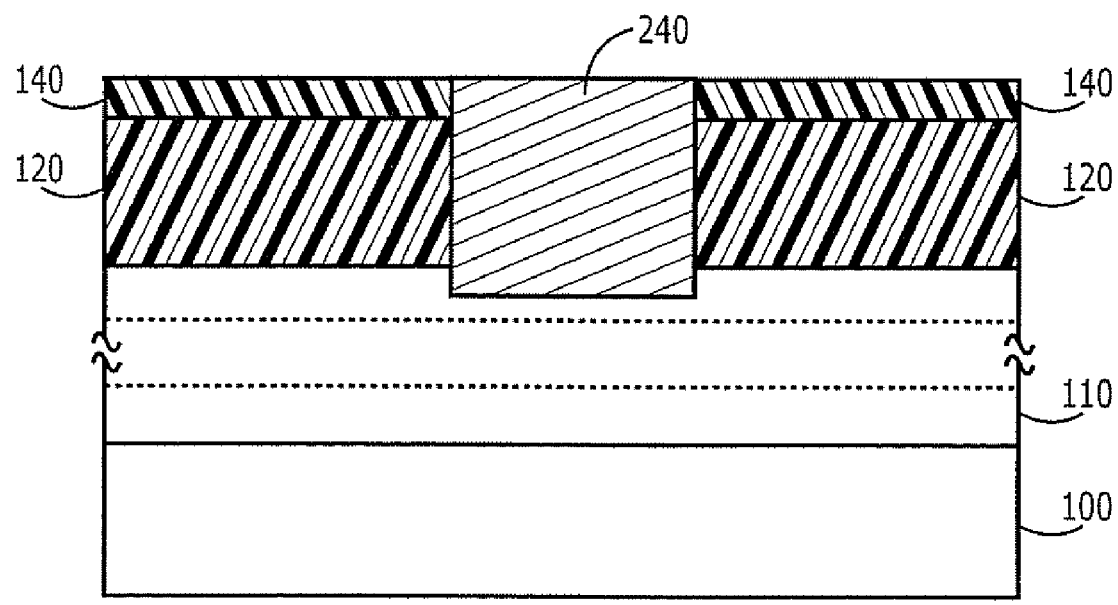

A photoresist layer is then deposited on the antireflective coating layer 200 and selectively etched (e.g., photolithographically patterned) to define a patterned photoresist layer 220. The photoresist layer may be formed to a thickness in a range from about 1100 Å to about 2500 Å. As illustrated by FIGS. 2C-2D, the patterned photoresist layer 220 is used as an etching mask during a step to selectively etch the antireflective coating 200 and hard mask layer 140 in sequence to define a first opening 130 therein. This first opening exposes an upper surface of the first dielectric layer 120. The patterned photoresist layer 220 and antireflective coating 200 are then stripped (i.e., removed) using an ashing process that exposes the upper surface of the hard mask layer 140. Following this ashing process, a portion of the first dielectric layer 120, which extends opposite the first opening 130, is selectively etched using the hard mask layer 140 as an etching mask. During this selective etching step, a layer of polymer residues 150 is accumulated directly on the upper surface of the hard mask layer 140, as illustrated by FIG. 2E. These polymer residues within the layer 150, which are generated as a by-product of the etching process, operate to increase a degree of etching selectively by protecting and inhibiting lateral recession of the hard mask layer 140 during the step of selectively etching the first dielectric layer 120. As illustrated by FIG. 2F, the selective etching step may continue for a sufficient duration to define an opening (e.g., via opening) extending through the first dielectric layer 120 and possibly into the multi-layered structure 110. The sidewalls and bottom of the opening may then be cleaned by exposing portions of the first dielectric layer 120 in the opening to a diluted hydrofluoric acid (DHF) solution. Damascene processing techniques may then be performed to form a copper interconnect via or wiring pattern 240 that fills the opening in the first dielectric layer 120.

Referring again to FIGS. 2E-2F, the step of selectively etching the first dielectric layer 120 may include selectively etching the first dielectric layer 120 using a dry etching technique. This dry etching technique may include using a fluorine-based source gas. In particular, the step of selectively etching the first dielectric layer 120 may include exposing the first dielectric layer (in the first opening 130) to a first source gas including CF4 and a second source gas including H2. To achieve a desired degree of etching selectively and etch rate, a ratio of a volumetric flow rate of the second source gas relative to the first source gas is greater than about 0.25 for the case where the first source gas is CF4 and the second source gas is H2. For example, the volumetric flow rate of the second source gas may be greater than about 40 sccm and a volumetric flow rate of the first source gas may be about 150 sccm.

In alternative embodiments of the invention, the fluorine-based source gas includes CF4 and CHF3 and a combined volumetric flow rate of CF4 and CHF3 is established in a range from about 10 scam to about 20 sccm. Higher flow rates of these combined gases (CF4 and CHF3) may result in relatively low etching selectivity of the first dielectric layer 120 relative to the hard mask layer 140. This fluorine-based source gas may also be combined with an oxygen (O₂) source gas that is supplied at a volumetric flow rate of about 10 sccm and an argon source gas that is supplied at a volumetric flow rate of about 400 sccm. In still further embodiments of the invention, the fluorine-based source gas may include a combination of CF4 and CH2F2 or a combination of CH3F and CH2F2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrical interconnect structure, comprising the steps of:

forming a first dielectric layer having a first dielectric constant on a semiconductor substrate;

forming a hard mask layer having a second dielectric constant greater than the first dielectric constant, on the first dielectric layer;

patterning a photoresist layer on an upper surface of the hard mask layer;

selectively etching the hard mask layer to define an opening therein that exposes the first dielectric layer, using the patterned photoresist layer as an etching mask;

stripping the patterned photoresist layer from the hard mask layer using an ashing process that exposes the upper surface of the hard mask layer; and selectively etching a portion of the first dielectric layer extending opposite the opening while simultaneously accumulating polymer residues directly on the upper surface of the hard mask layer, using the hard mask layer as an etching mask.

2. The method of claim 1, wherein said step of selectively etching a portion of the first dielectric layer comprises selectively etching a portion of the first dielectric layer using a dry etching technique.

3. The method of claim 2, wherein the accumulated polymer residues inhibit recession of the hard mask layer during said step of selectively etching a portion of the first dielectric layer.

4. The method of claim 2, wherein said step of selectively etching a portion of the first dielectric layer comprises exposing the portion of the first dielectric layer to a fluorine-based source gas.

5. The method of claim 4, wherein said step of selectively etching a portion of the first dielectric layer comprises exposing the portion of the first dielectric layer to a first source gas comprising CF4 and a second source gas comprising H2.

6. The method of claim 5, wherein the first source gas is CF4 and the second source gas is H2; and wherein a ratio of a volumetric flow rate of the second source gas relative to the first source gas is greater than about 0.25.

7. The method of claim 6, wherein the first dielectric layer is a p-SiCOH layer.

8. The method of claim 5, wherein a volumetric flow rate of the second source gas is greater than about 40 sccm and a volumetric flow rate of the first source gas is about 150 sccm.

9. The method of claim 4, wherein the fluorine-based source gas comprises CF4 and CHF3.

10. The method of claim 9, wherein a combined volumetric flow rate of CF∝ and CHF3 is in a range from about 10 sccm to about 20 sccm.

11. The method of claim 10, wherein said step of selectively etching a portion of the first dielectric layer comprises exposing the portion of the first dielectric layer to an oxygen ($O_2$) source gas at a volumetric flow rate of about 10 sccm and an argon source gas at a volumetric flow rate of about 400 sccm.

12. The method of claim 4, wherein the fluorine-based source gas comprises CF4 and CH2F2.

13. The method of claim 4, wherein the fluorine-based source gas comprises CH3F and CH2F2.

14. The method of claim 4, wherein the fluorine-based source gas is mixed with an argon gas during said step of selectively etching a portion of the first dielectric layer.

15. The method of claim 1, wherein the hard mask layer comprises an electrically insulating layer selected from a group consisting of silicon dioxide and tetraethylorthosilicate (TEOS).

16. The method of claim 1, wherein said step of patterning a photoresist layer on the hard mask layer is preceded by a step of depositing an antireflective coating directly on the upper surface of the hard mask layer; and wherein said stripping step comprises stripping the patterned photoresist layer and the antireflective coating from the hard mask layer.

17. The method of claim 1, wherein said step of selectively etching a portion of the first dielectric layer is followed by a step of exposing the etched portion of the first dielectric layer to a diluted hydrofluoric acid (DHF) solution.

18. The method of claim 1, wherein said step of selectively etching a portion of the first dielectric layer comprises etching an opening in the first dielectric layer; and wherein said step of selectively etching a portion of the first dielectric layer is followed by a step of forming a copper interconnect via in the etched opening.

19. A method of forming an electrical interconnect structure, comprising the steps of:

forming a dielectric layer on a semiconductor substrate;

forming a hard mask layer on the dielectric layer;

patterning a photoresist layer on an upper surface of the hard mask layer;

selectively etching the hard mask layer to define an opening therein that exposes the dielectric layer, using the patterned photoresist layer as an etching mask; then stripping the patterned photoresist layer from the hard mask layer using an ashing process; and then selectively dry etching a portion of the dielectric layer extending opposite the opening by exposing the portion of the dielectric layer to a CF4 source gas and an H2 source gas at respective rates that establish a volumetric flow rate ratio of H2/CF4 at greater than about 0.25.

20. A method of forming an electrical interconnect structure, comprising the steps of:

forming a dielectric layer on a semiconductor substrate;

forming a hard mask layer on the dielectric layer;

patterning a photoresist layer on an upper surface of the hard mask layer;

selectively etching the hard mask layer to define an opening therein that exposes the dielectric layer, using the patterned photoresist layer as an etching mask; then stripping the patterned photoresist layer from the hard mask layer using an ashing process; and then selectively dry etching a portion of the dielectric layer extending opposite the opening by exposing the portion of the dielectric layer to CF4 and CHF3 source gases at a combined volumetric flow rate in a range from about 10 sccm to about 20 sccm.

\* \* \* \* \*

UNITED STATES PATENT AND TRADEMARK OFFICE
CERTIFICATE OF CORRECTION

PATENT NO. : 7,488,687 B2 Page 1 of 1
APPLICATION NO. : 11/530952
DATED : February 10, 2009
INVENTOR(S) : Park et al.

It is certified that error appears in the above-identified patent and that said Letters Patent is hereby corrected as shown below:

Column 5, Claim 10, Line 40: Please correct "CF∝" to read -- CF4 --

Signed and Sealed this

Seventh Day of April, 2009

JOHN DOLL
*Acting Director of the United States Patent and Trademark Office*